United States Patent
Itoh

(10) Patent No.: US 8,135,368 B2
(45) Date of Patent: Mar. 13, 2012

(54) RECEIVER

(75) Inventor: Hiroya Itoh, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 573 days.

(21) Appl. No.: 12/332,170

(22) Filed: Dec. 10, 2008

(65) Prior Publication Data

US 2009/0163163 A1    Jun. 25, 2009

(30) Foreign Application Priority Data

Dec. 13, 2007   (JP) .................................. 2007-322085

(51) Int. Cl.
    *H04B 1/06* (2006.01)
(52) U.S. Cl. ................................. 455/234.1; 455/67.11
(58) Field of Classification Search ............... 455/234.1, 455/241.2, 245.2, 67.1, 323; 375/347; 348/726
    See application file for complete search history.

(56) References Cited

U.S. PATENT DOCUMENTS

| | | | | |
|---|---|---|---|---|
| 5,513,222 A * | 4/1996 | Iwasaki | ......................... | 375/347 |
| 5,659,582 A * | 8/1997 | Kojima et al. | ................. | 375/345 |
| 5,678,198 A * | 10/1997 | Lemson | ...................... | 455/67.11 |
| 5,867,777 A * | 2/1999 | Yamaji et al. | ............... | 455/234.1 |
| 5,999,559 A * | 12/1999 | Takaki | ............................ | 375/130 |
| 6,075,978 A * | 6/2000 | Tsumura | ...................... | 455/234.1 |
| 6,657,678 B1 * | 12/2003 | Mizukami et al. | ............ | 348/726 |
| 6,775,336 B1 * | 8/2004 | Takaki | ............................ | 375/345 |
| 7,076,231 B2 * | 7/2006 | Yamawaki et al. | ............ | 455/323 |
| 7,113,758 B2 * | 9/2006 | Kishi | .......................... | 455/234.1 |
| 7,212,796 B2 * | 5/2007 | Okanobu | .................... | 455/234.1 |

FOREIGN PATENT DOCUMENTS

| | | |
|---|---|---|
| JP | 2006-050585 | 2/2006 |
| JP | 2006-109335 | 4/2006 |
| JP | 2006-237793 | 9/2006 |
| JP | 2006-527962 | 12/2006 |
| JP | 2007-097123 | 4/2007 |
| WO | 2004/112384 | 12/2004 |

OTHER PUBLICATIONS

Sakai et al, A Digital TV Receiver RF and BB Chipset with Adaptive Bias-Current Control for Mobile Applications, ISSCC 2007 Session 11.4.

Japanese Office Action for Japanese Patent Application No. 2007-322085 mailed on Jul. 29, 2011.

* cited by examiner

*Primary Examiner* — Jean Jeanglaude
(74) *Attorney, Agent, or Firm* — Turocy & Watson, LLP

(57) ABSTRACT

A receiver has a pre-stage variable gain amplifier configured to amplify an RF signal received by an antenna, a frequency converter configured to convert an output signal of the pre-stage variable gain amplifier into a low frequency signal to output the low frequency signal, a filter unit configured to selectively extract a receiving channel frequency band component from the low frequency signal, a post-stage variable gain amplifier configured to amplify the output signal of the filter unit, a pre-stage amplifier controller configured to adjust a gain of the pre-stage variable gain amplifier so that an output amplitude of the frequency converter approaches a target value, a post-stage amplifier controller configured to adjust a gain of the post-stage variable gain amplifier so that an output amplitude of the post-stage variable gain amplifier approaches a target value, and an adaptive controller configured to detect a receiving status based on the gain of the pre-stage variable gain amplifier and the gain of the post-stage variable gain amplifier, and control a circuit property of at least a portion of a circuit block from the pre-stage variable gain amplifier to the post-stage variable gain amplifier based on the detected result.

18 Claims, 16 Drawing Sheets

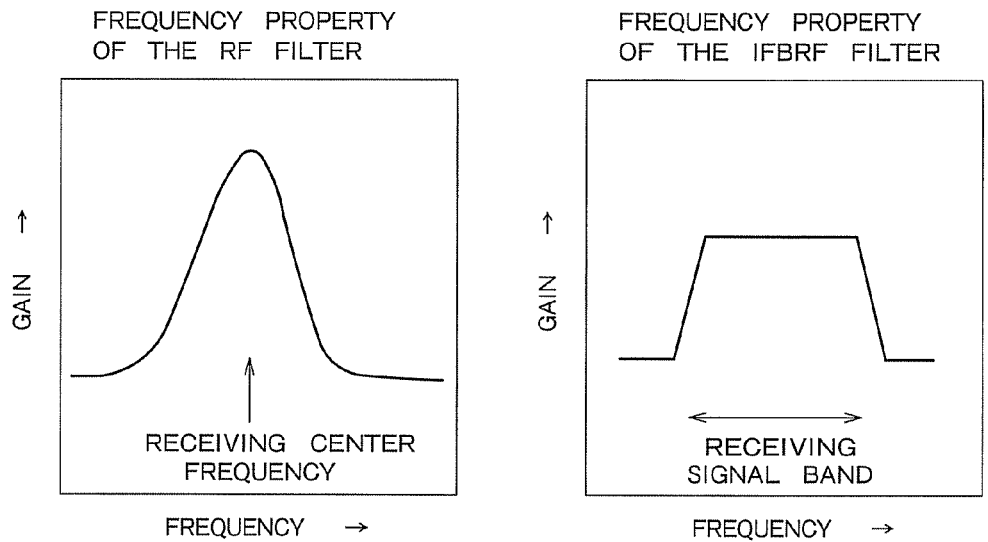
FIG. 2A
FIG. 2B
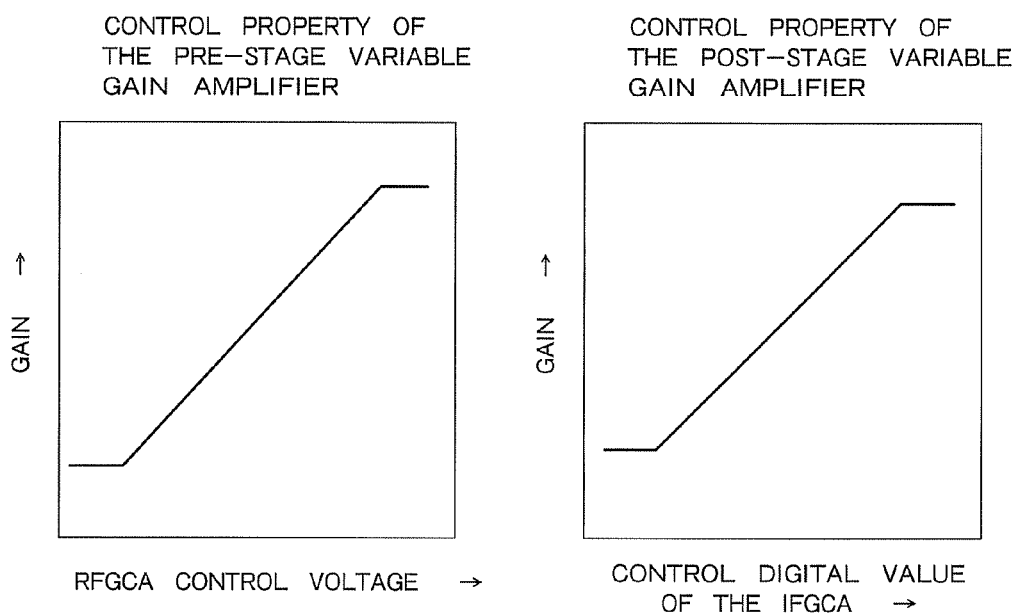
FIG. 2C
FIG. 2D

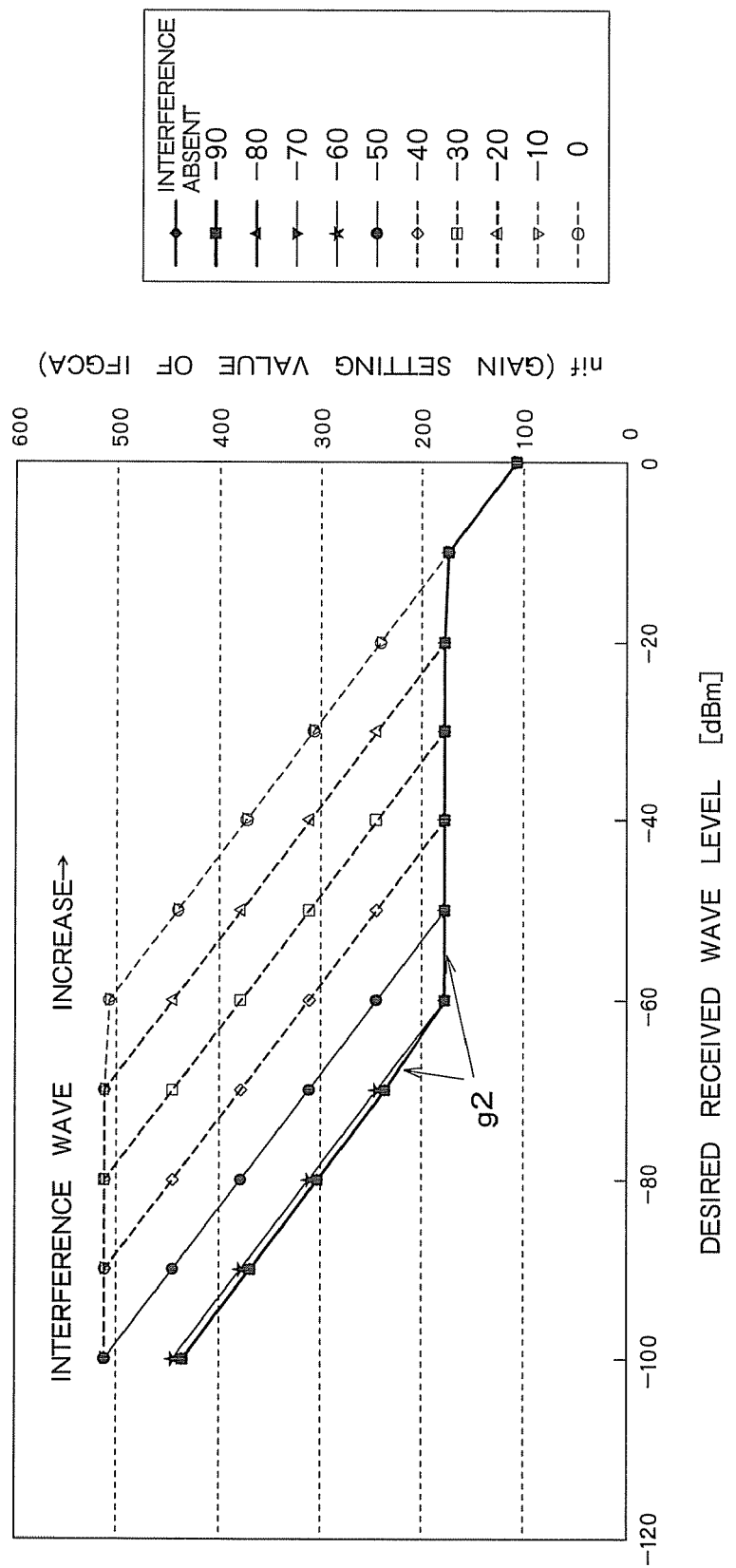
F I G. 4

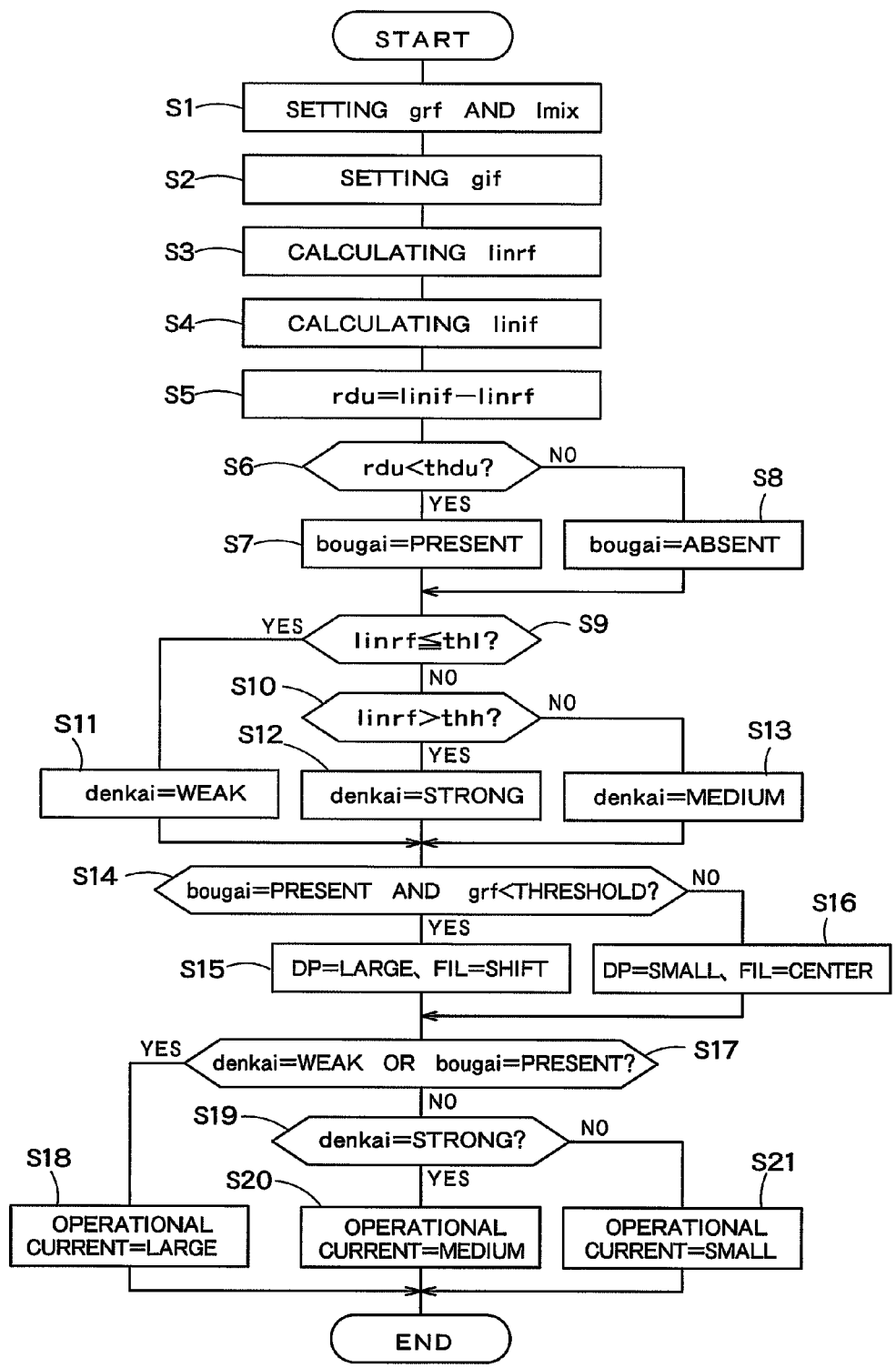
F I G. 6

| FIELD INTENSITY DETERMINATION / INTERFERENCE DETERMINATION | WEAK ELECTRIC FIELD | MEDIUM ELECTRIC FIELD | STRONG ELECTRIC FIELD |
|---|---|---|---|
| INTERFERENCE WAVE ABSENT | CURRENT LARGE, DP SMALL, FIL CENTER | CURRENT SMALL, DP SMALL, FIL CENTER | CURRENT MEDIUM, DP SMALL, FIL CENTER |
| INTERFERENCE WAVE PRESENT | CURRENT LARGE, DP LARGE, FIL SHIFT | CURRENT LARGE, DP LARGE, FIL SHIFT | CURRENT LARGE, DP LARGE, FIL SHIFT |

F I G. 10

| FREQUENCY DEVIATION [MHz] | −60 | −40 | −20 | 0 | +20 | +40 | +60 |
|---|---|---|---|---|---|---|---|
| PASSING GAIN [dB] | −30 | −15 | −5 | 0 | −5 | −15 | −30 |

F I G. 11

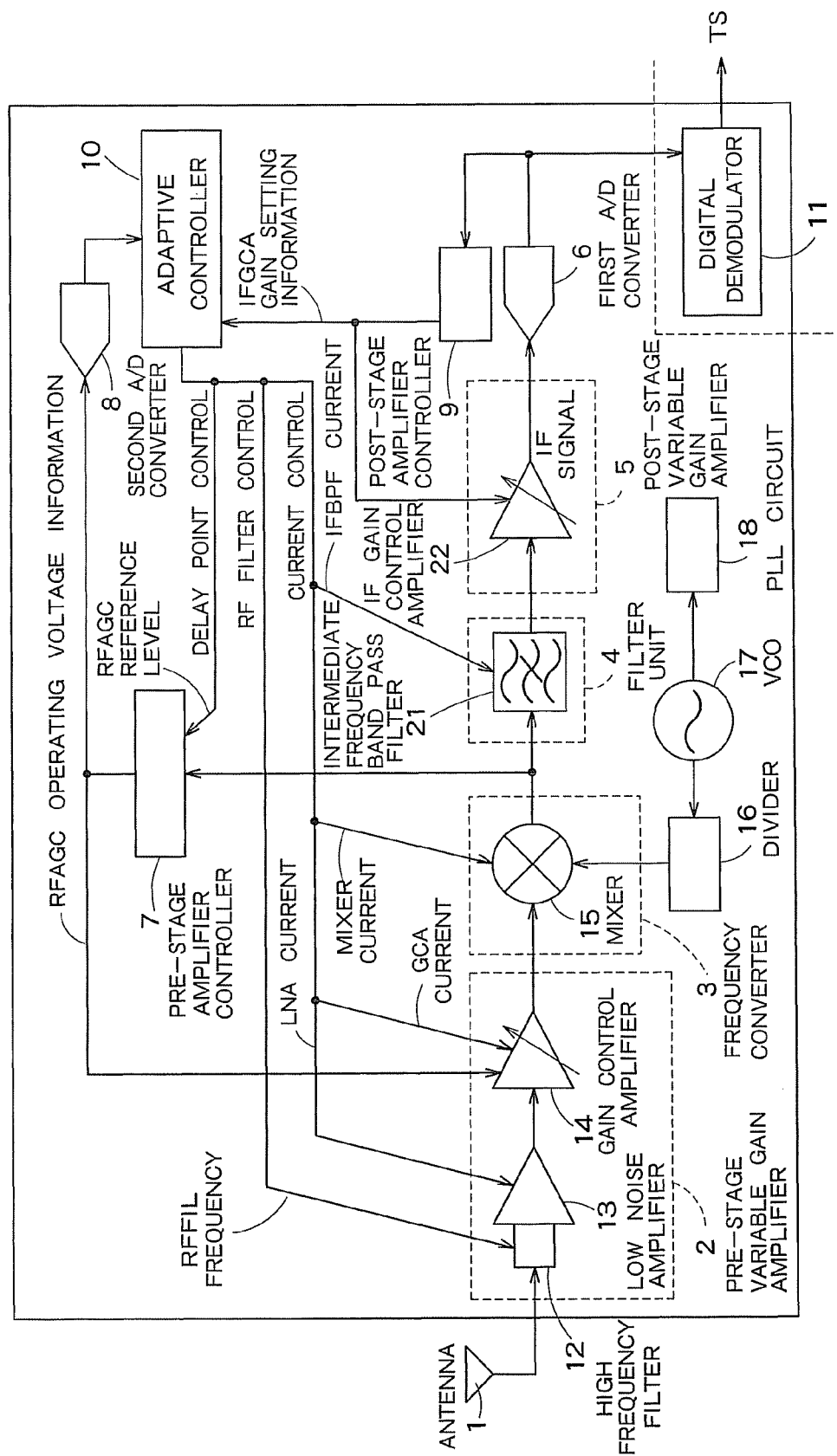
F I G. 14

RECEIVER

CROSS REFERENCE TO RELATED APPLICATIONS

This application is based upon and claims the benefit of priority from the prior Japanese Patent Application No. 2007-322085, filed on Dec. 13, 2007, the entire contents of which are incorporated herein by reference.

BACKGROUND OF THE INVENTION

1. Field of the Invention

The present invention relates to a receiver that can be used for reception of analog television broadcasting or digital television broadcasting, for example.

2. Related Art

As one-segment broadcasting becomes widespread, a case where small electronic equipment, such as a cellular phone, has a built-in receiver for television (hereinafter, TV) reception has been increased. Most of this kind of the electronic equipment that has a built-in receiver is driven by a battery. It is important to reduce power consumption of the receiver as much as possible.

There has been proposed a receiver embodied with a semiconductor chip with reduced power consumption (http://Ipc.watch.impress.co.jp/docs/2007/0214/isscc03.htm). The proposed receiver determines a receiving status automatically, and controls each circuit constant in an analog signal processing circuit of a tuner unit to an optimal value depending on the receiving status.

However, the apparatus requires several hundred milliseconds to several seconds to determine the receiving status with accuracy, thereby failing to provide good response time. Further, when the receiving status is determined by using a digital demodulated signal, the digital demodulation processing takes time and thus the receiving status cannot be determined promptly.

SUMMARY OF THE INVENTION

According to one aspect of the present invention, A receiver comprising:

pre-stage variable gain amplifier configured to amplify an RF signal received by an antenna;

a frequency converter configured to convert an output signal of the pre-stage variable gain amplifier into a low frequency signal to output the low frequency signal;

a filter unit configured to selectively extract a receiving channel frequency band component from the low frequency signal;

a post-stage variable gain amplifier configured to amplify the output signal of the filter unit;

a pre-stage amplifier controller configured to adjust a gain of the pre-stage variable gain amplifier so that an output amplitude of the frequency converter approaches a target value;

a post-stage amplifier controller configured to adjust a gain of the post-stage variable gain amplifier so that an output amplitude of the post-stage variable gain amplifier approaches a target value; and an adaptive controller configured to detect a receiving status based on the gain of the pre-stage variable gain amplifier and the gain of the post-stage variable gain amplifier, and control a circuit property of at least a portion of a circuit block from the pre-stage variable gain amplifier to the post-stage variable gain amplifier based on the detected result.

According to the other aspect of the present invention, A receiver comprising:

a pre-stage variable gain amplifier configured to amplify an RF signal received by an antenna;

a frequency converter configured to convert an output signal of the pre-stage variable gain amplifier into a low frequency signal to output the low frequency signal;

a filter unit configured to selectively extract a receiving channel frequency band component from the low frequency signal;

a post-stage variable gain amplifier configured to amplify the output signal of the filter unit;

a pre-stage amplifier controller configured to adjust a gain of the pre-stage variable gain amplifier so that an output amplitude of the frequency converter approaches a target value;

a post-stage amplifier controller configured to adjust a gain of the post-stage variable gain amplifier so that an output amplitude of the post-stage variable gain amplifier approaches a target value; and an adaptive controller configured to detect a receiving status based on the gain of the pre-stage variable gain amplifier, the gain of the post-stage variable gain amplifier and an output signal amplitude of the post-stage variable gain amplifier, and control a circuit property of at least a portion of a circuit block from the pre-stage variable gain amplifier to the post-stage variable gain amplifier based on the detected result.

BRIEF DESCRIPTION OF THE DRAWINGS

FIG. 2A is a graph showing an example of a property of an RF filter 12, FIG. 2B is a graph showing an example of a control property of a pre-stage variable gain amplifier 2, FIG. 2C is a graph showing an example of a frequency property of an IFBPF 21, and FIG. 2D is a graph showing an example of a control property of a post-stage variable gain amplifier 5;

FIG. 4 is a graph showing a property of a digital gain setting value of an IFGCA 22;

FIG. 6 is a flowchart showing an example of a procedure of interference determination and electric field determination performed by an adaptive controller 10;

FIG. 10 is a table listing control patterns of the adaptive controller 10;

FIG. 11 is a table showing an example of a passing property of the RF filter 12;

FIG. 14 is a block diagram showing a schematic structure of a receiver according to a second embodiment of the present invention;

DETAILED DESCRIPTION OF THE INVENTION

Embodiments according to the present invention will now be explained with reference to the accompanying drawings.

First Embodiment

Figure 1:
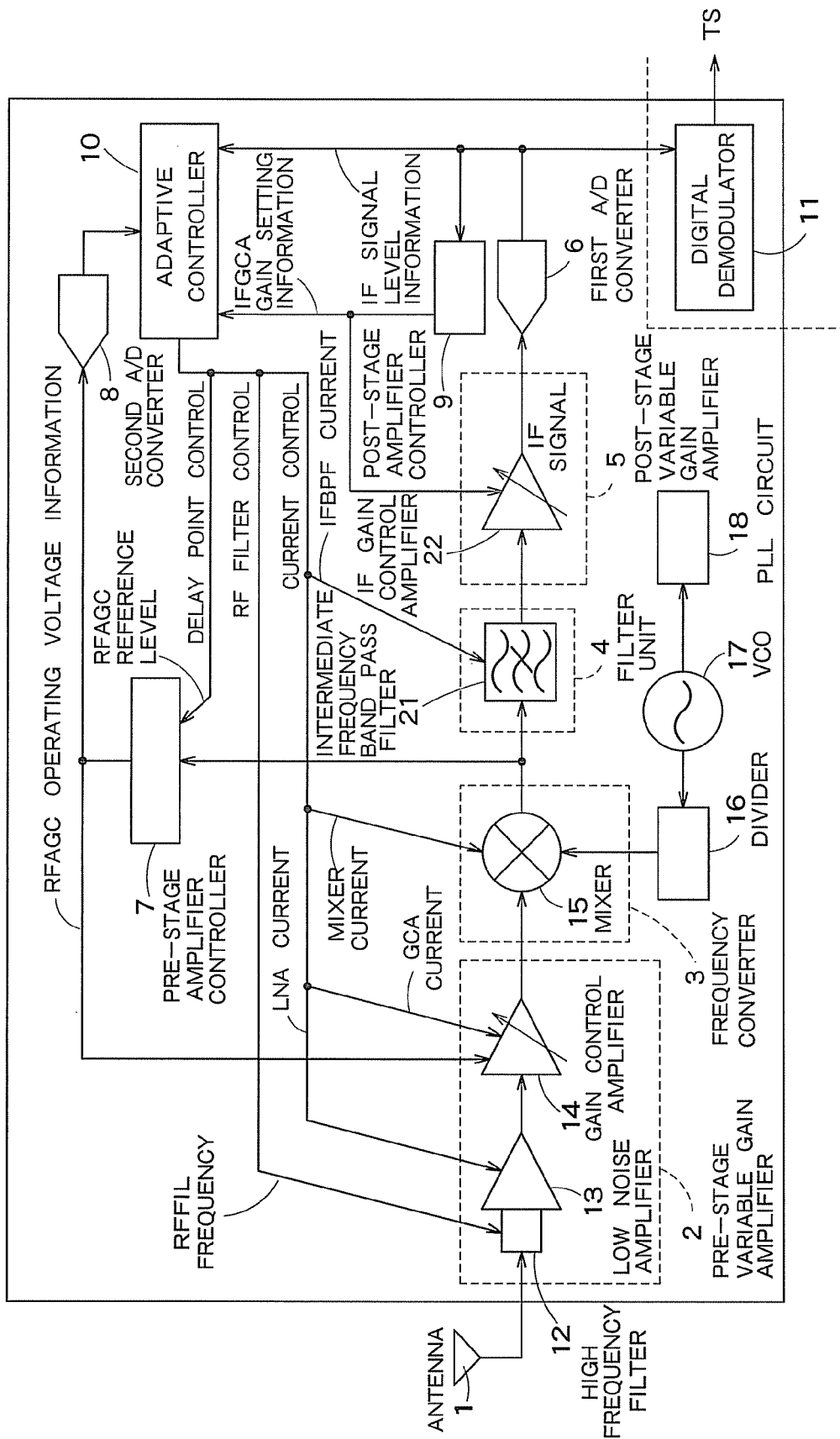
FIG. 1 is a block diagram showing a schematic structure of a receiver according to a first embodiment of the present invention.

FIG. 1 is a block diagram showing a schematic structure of a receiver according to a first embodiment of the present invention. The receiver in FIG. 1 intends to receive TV broadcast waves. The receiver in FIG. 1 includes a pre-stage variable gain amplifier 2 connected to an antenna 1, a frequency converter 3 connected to the post-stage of the pre-stage variable gain amplifier 2, a filter unit 4 connected to the post-stage of the frequency converter 3, a post-stage variable gain amplifier 5 connected to the post-stage of the filter unit 4, a first A/D converter (ADC1) 6 that converts an output signal from the post-stage variable gain amplifier 5 to a digital value, a pre-stage amplifier controller (RFAGC) 7 that adjusts a gain of the pre-stage variable gain amplifier 2, a second A/D converter (ADC2) 8 that converts an output signal from the pre-stage amplifier controller 7 to a digital value, a post-stage amplifier controller (Ctrl) 9 that adjusts a gain of the post-stage variable gain amplifier 5, an adaptive controller 10 that optimizes operation of each part in the receiver depending on receiving states, and a digital demodulator 11 that performs demodulation processing based on the digital value output from the first A/D converter 6.

The pre-stage variable gain amplifier 2 has a low noise amplifier (LNA) 13 to which a high frequency filter (RF filter) 12 is attached, and a gain control amplifier (RFGCA) 14.

The frequency converter 3 has a mixer (MIXER) 15, and receives a local oscillation signal generated in a divider (DIV) 16, a voltage-controlled oscillator (VCO) 17, and a PLL circuit 18. The divider 16 divides an oscillating signal generated in the VCO 17 and the PLL circuit 18 to generate the local oscillation signal.

The following describes an operation of the receiver in FIG. 1. A broadcast wave signal in an RF (high frequency) band (90 MHz to 770 MHz in the VHF band and the UHF band for TV in Japan) received by the antenna 1 is input to the LNA 13. The RF filter 12 attached to the LNA 13 passes through only signal components whose frequencies are close to desired frequencies. The LNA 13 amplifies a received signal by about 10 to 20 dB, and supplies it to the RFGCA 14.

FIG. 2A is a graph showing an example of a property of the RF filter 12, and the horizontal axis represents the frequency and the vertical axis represents the gain. As shown in FIG. 2A, the RF filter 12 has the passing property of the narrow band where the gain becomes largest at the center frequency.

The RFGCA 14 controls the gain of an input signal by the gain control voltage supplied from the pre-stage amplifier controller 7. FIG. 2B is a graph showing an example of a control property of the pre-stage variable gain amplifier 2, and the horizontal axis represents the gain control voltage level and the vertical axis represents the gain. As shown in FIG. 2B, the gain changes linear depending on the gain control voltage.

An output signal from the RFGCA 14 is input to the mixer 15. The mixer 15 mixes the output signal from the RFGCA 14 with the local oscillation signal generated in the divider 16, generates frequency components of the sum and the difference of both of the signals, and supplies them to the filter unit 4.

An intermediate frequency band pass filter (IFBPF) 21 in the filter unit 4 selects only a receiving IF signal (429 kHz bandwidth centered on 500 kHz in the case of one-segment broadcasting) among the output signals from the mixer 15. Among the components of the sum and the difference generated in the mixer 15, the component of the sum is removed because it is out of the pass band of the band passing property of the IFBPF 21, and the image signal component that becomes unnecessary among the components of the difference is removed by using the image rejection function of the IFBPF 21.

FIG. 2C is a graph showing an example of a frequency property of the IFBPF 21, and the horizontal axis represents the frequency and the vertical axis represents the gain. As shown in FIG. 2C, since the gain is set only in a received signal band, the IFBPF 21 passes through the signal component only in the received signal band. The IF signal that has passed through the IFBPF 21 is supplied to the post-stage variable gain amplifier 5.

A gain of an IF gain control amplifier (IFGCA) 22 in the post-stage variable gain amplifier 5 is controlled by the digital value generated in the post-stage amplifier controller 9. Accordingly, the IFGCA 22 amplifies the IF signal with a desired amplification degree, and supplies it to the first A/D converter 6.

FIG. 2D is a graph showing an example of the control property of the post-stage variable gain amplifier 5, and the horizontal axis represents the digital gain setting value of the IFGCA 22 and the vertical axis represents the gain.

The receiver in FIG. 1 has two auto gain control (AGC) loops. One is an RFAGC loop. The pre-stage amplifier controller 7 detects an output signal amplitude of the mixer 15, and compares it with a preset target value. When there is a difference between the output signal amplitude and the preset target value, the pre-stage amplifier controller 7 adjusts the gain control voltage so that the output signal amplitude of the mixer 15 will approach the target value, and supplies it to the RFGCA 14. The other is an IFGCA 22 loop. The post-stage amplifier controller 9 detects the IF signal output from the IFGCA 22 by using the digital value output from the first A/D converter 6, generates a digital gain setting value so that a signal amplitude of the IF signal will approach a target value, and supplies it to the IFGCA 22.

One of characteristic features in the present embodiment is in that the adaptive controller 10 is provided. Each of the input and output signals to and from the adaptive controller 10 is a digital value, and the adaptive controller 10 performs digital signal processing. The adaptive controller 10 performs delay point control of the RFGCA 14, a control of the RF filter 12, a current control of each part in the receiver, for example.

The input signals to the adaptive controller 10 include a digital value obtained by converting the gain control voltage for the RFGCA 14 that is generated in the pre-stage amplifier controller 7 by the second A/D converter 8, the digital gain setting value for the IFGCA 22 that is generated in the post-stage amplifier controller 9, and an IF signal level value obtained by converting the IF signal by the first A/D converter 6.

The output signals from the adaptive controller 10 include a signal for increasing and decreasing the operational current of the LNA 13, the RFGCA 14, the mixer 15, and the IFBPF 21, an RFAGC reference level signal for setting a delay point of the RFGCA 14, and a signal that sets a passing center frequency of the RF filter 12.

The general operation of the adaptive controller 10 will be described hereinafter. The adaptive controller 10 determines the presence of an interference wave and determines the field intensity by using the above-mentioned three kinds of input signals, and generates a signal that controls the operational current of each part inside of the receiver, a signal that controls the delay point of the RFGCA 14, and a signal that controls the passing center frequency of the RF filter 12, based on these two determination results.

The interference wave will be more specifically described hereinafter. An RF signal received in the antenna 1 includes a received wave (which is also called as a desired wave) that is a signal of a receiving channel, and the interference wave that is independent to the receiving channel. When receiving in the UHF band, all broadcast waves other than the receiving channel in 470 to 770 MHz are interference waves. Although the interference wave usually includes a plurality of frequency components, the signal amplitude of each frequency component is added and combined to become one wave. The present embodiment concerns two waves of the received wave and the interference wave.

In the receiver in FIG. 1, the received wave and the interference wave are simultaneously transmitted to the mixer 15. The received wave and the interference wave are included also in the signal component converted to low frequency conversion by the mixer 15. Therefore, the pre-stage amplifier controller 7 detects a summing signal of the received wave and the interference wave, to say simply, a signal amplitude of the larger one between the received wave and the interference wave. The RFAGC loop performs a feedback control so that an amplitude value of the larger one between the received wave and the interference wave will become a target amplitude value.

Figure 3:
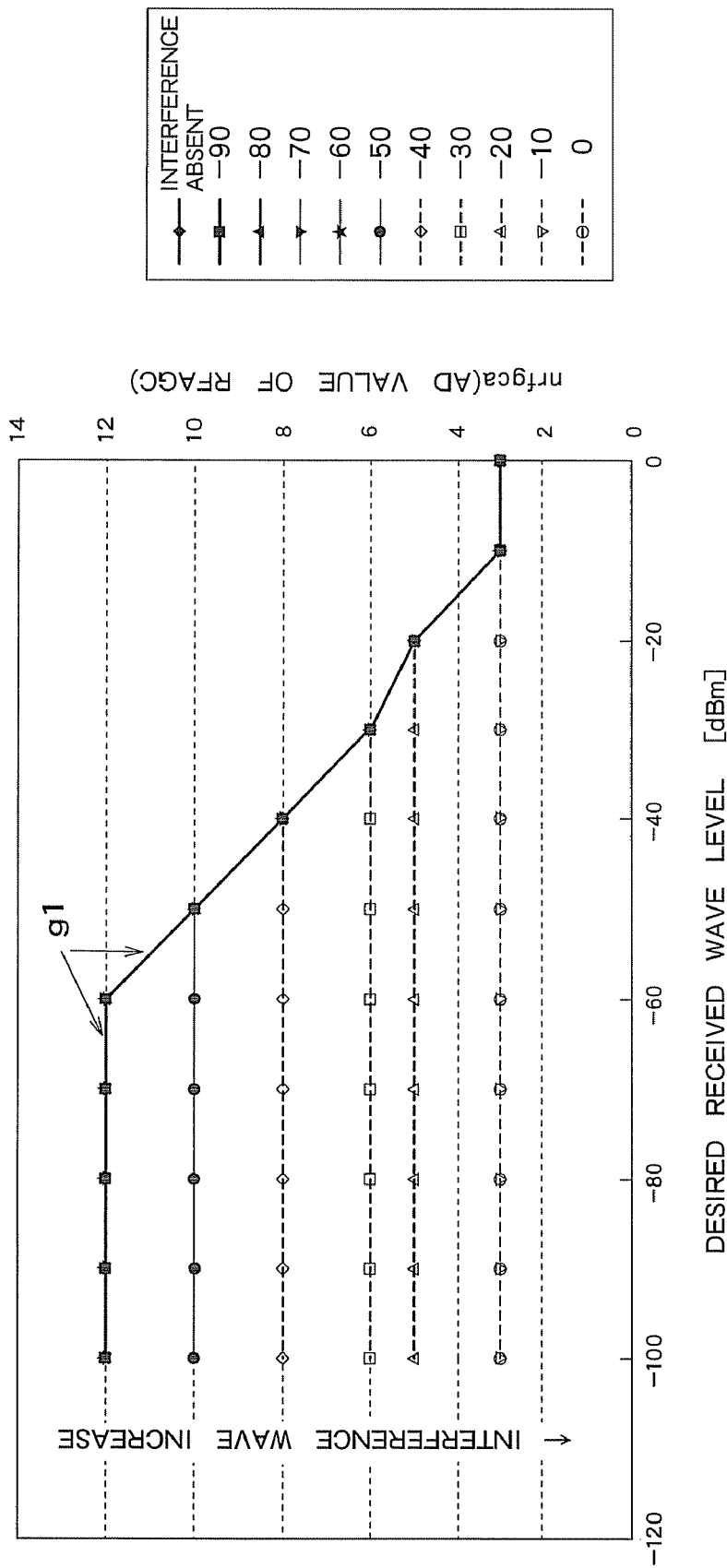
FIG. 3 is a graph showing a property of a digital value obtained by converting a gain control voltage output from a pre-stage amplifier controller 7 by a second A/D converter 8.

FIG. 3 is a graph showing a property of the digital value obtained by converting the gain control voltage output from the pre-stage amplifier controller 7 by the second A/D converter 8. In FIG. 3, the horizontal axis represents the desired received wave level [dBm] input to the RF filter 12, and the vertical axis represents the digital value of the gain control voltage.

FIG. 3 shows the graphs showing a property corresponding to eleven types of interference waves with different levels. The graph line g1 illustrated in FIG. 3 is a case where no interference wave is present. The digital value becomes small as the interference wave increases.

When the received signal passes through the mixer 15 and the IFBPF 21, only a low frequency IF band converted wave of the desired received wave included in the received signal is sent to the post-stage side as an IF signal due to a frequency selective property of the IFBPF 21. Therefore, the component of the interference wave is present before an input part of the IFBPF 21, and is removed at an output part of the IFBPF 21. For example, when the interference wave is larger than the received wave, the interference wave is a main component at the input part of the IFBPF 21 and the received wave component is relatively small. In this case, the received wave component of the output part of the IFBPF 21 is also relatively small. Accordingly, the gain of the IFGCA 22 is increased so that the signal amplitude is raised to a target IF signal level. In a state where the interference wave is large, even if the gain of the IFGCA 22 is raised to the maximum, the amplitude of the IF signal output may be smaller than a target value.

FIG. 4 is a graph showing a property of the digital gain setting value of the IFGCA 22, and the horizontal axis represents the desired received wave level [dBm] input to the RF filter 12 and the vertical axis represents the digital gain setting value of the IFGCA. The graph line g2 illustrated in FIG. 4 is a case where no interference wave is present. The graph line shifts rightward as the interference wave increases.

Figure 5:
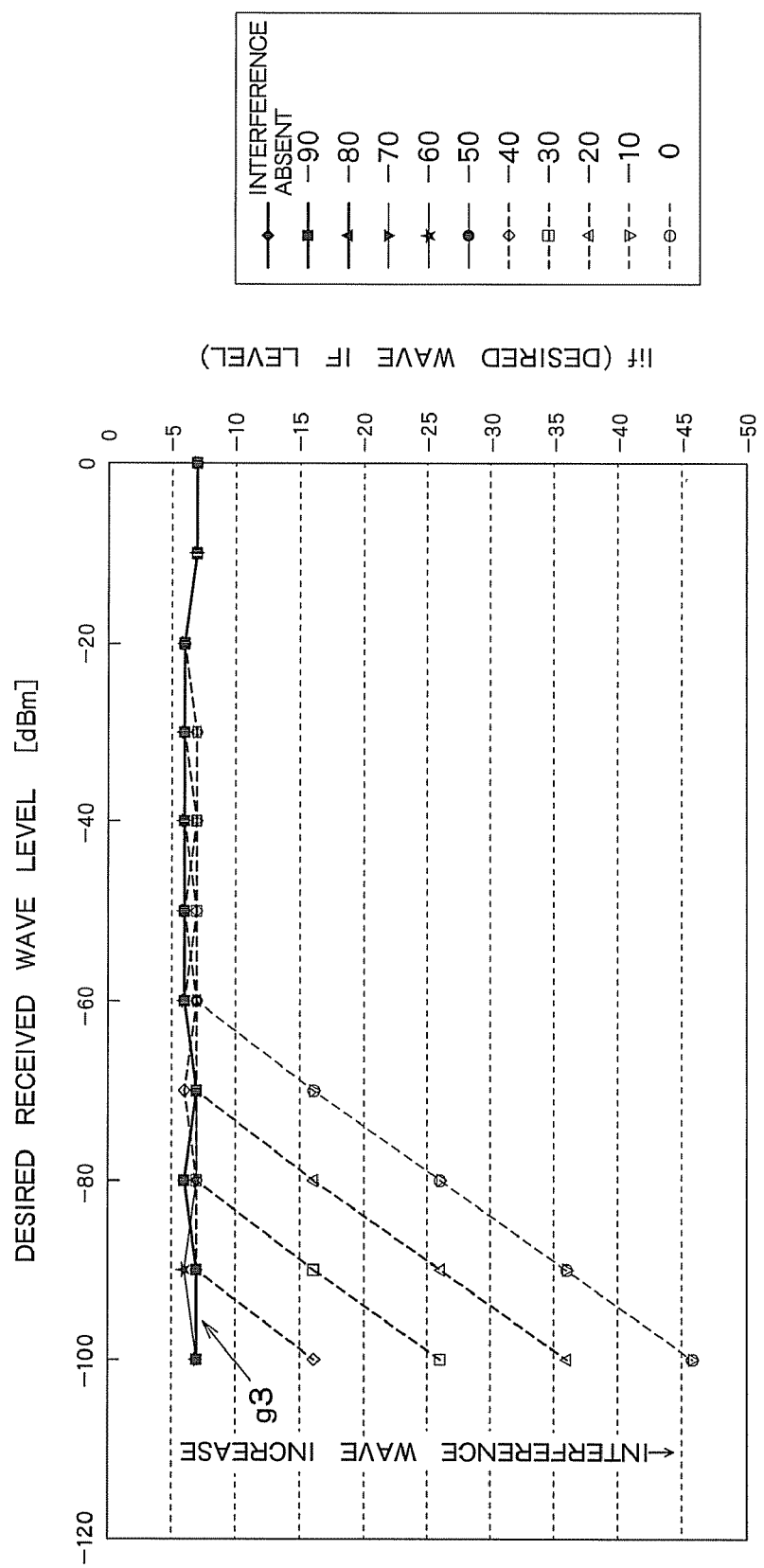
FIG. 5 is a graph showing a property of a digital IF signal obtained by converting an IF signal output from the IFGCA 22 by a first A/D converter 6 according to the first embodiment.

FIG. 5 is a graph showing a property of the digital IF signal obtained by converting the IF signal output from the IFGCA 22 by the first A/D converter 6. In FIG. 5, the horizontal axis represents the desired received wave level [dBm] input to the RF filter 12, and the vertical axis represents the digital IF signal. The graph line g3 illustrated in FIG. 5 is a case where no interference wave is present. The level of the digital IF signal hardly changes. The graph line shifts to rightward as the interference wave increases.

Further, in FIG. 5, the level slightly changes near the graph line g3 due to a quantization error.

As apparent from FIGS. 3 to 5, the graphs change depending on the presence/absence of the interference wave. By using the properties of FIGS. 3 to 5, the field intensity also can be determined.

FIG. 6 is a flowchart showing an example of a procedure of interference determination and electric field determination performed by the adaptive controller 10. First, by using a gradient grfa of the gain of the pre-stage variable gain amplifier 2 and an intercept grfb of a reference gain in the RFAGC loop, a digital value nrf of the gain control voltage is converted to a gain grf of the pre-stage variable gain amplifier 2, and an amplitude target value Imix of a RF part in the output part of the mixer 15 is set (Step S1).

Next, a digital gain setting value nif is converted to a gain gif of the post-stage variable gain amplifier 5 by using a gradient gifa of the gain of the post-stage variable gain amplifier 5 and an intercept gifb of a reference gain in an IFGCA loop (Step S2).

By deducting the gain grf of the pre-stage variable gain amplifier 2 from the output level Imix of the mixer 15, the RF input level linrf calculated from the RF part is calculated (Step S3). The following equation (1) expresses linrf.

$$linrf = lmix - grf \quad (1)$$

Next, when the sum of the gain grf of the pre-stage variable gain amplifier 2 and the gain gif of the post-stage variable gain amplifier 5 is deducted from a digital IF signal level lif, the RF input level linif calculated from the IF signal side can be calculated (Step S4). The following equation (2) expresses linif.

$$linif = lif - (grf + gif) \quad (2)$$

When an interference wave is larger than a received wave, linrf is strongly affected by the interference wave, while linif is not affected by the interference wave. Therefore, when the interference wave is larger than the received wave, the difference between the two RF input levels linrf and linif is exactly a level difference between the interference wave and the received wave. This level difference is called as a DU ratio (D: desire, U: undesire) and represents as rdu (Step S5). The rdu is expressed by the following equation (3).

$$rdu = linif - linrf = lif - lmix - gif \quad (3)$$

When the interference wave is present, rdu becomes a negative value. Whether or not the interference wave is present can be determined based on the value of rdu. Specifically, rdu is compared with an interference determination threshold thdu (Step S6). If rdu is smaller than thdu, it is determined that the interference wave is present and a variable bougai is set as "present" (Step S7). On the other hand, if rdu is equal to or larger than thdu, it is determined that no interference wave is present and the variable bougai is set as "absent" (Step S8).

Meanwhile, the field intensity can be determined by the RF input level linrf that includes the interference wave. Specifically, it is determined as a weak electric field in a case where linrf is equal to or smaller than a weak electric field threshold thl (Steps S9 and S10), and it is determined as a strong electric field in a case where linrf is larger than a strong electric field threshold thh (Steps S11 and S12), and otherwise it is determined as a medium electric field (Step S13). Thus, a variable denkai can take three types of values: "weak", "medium", and "strong".

Figure 7:
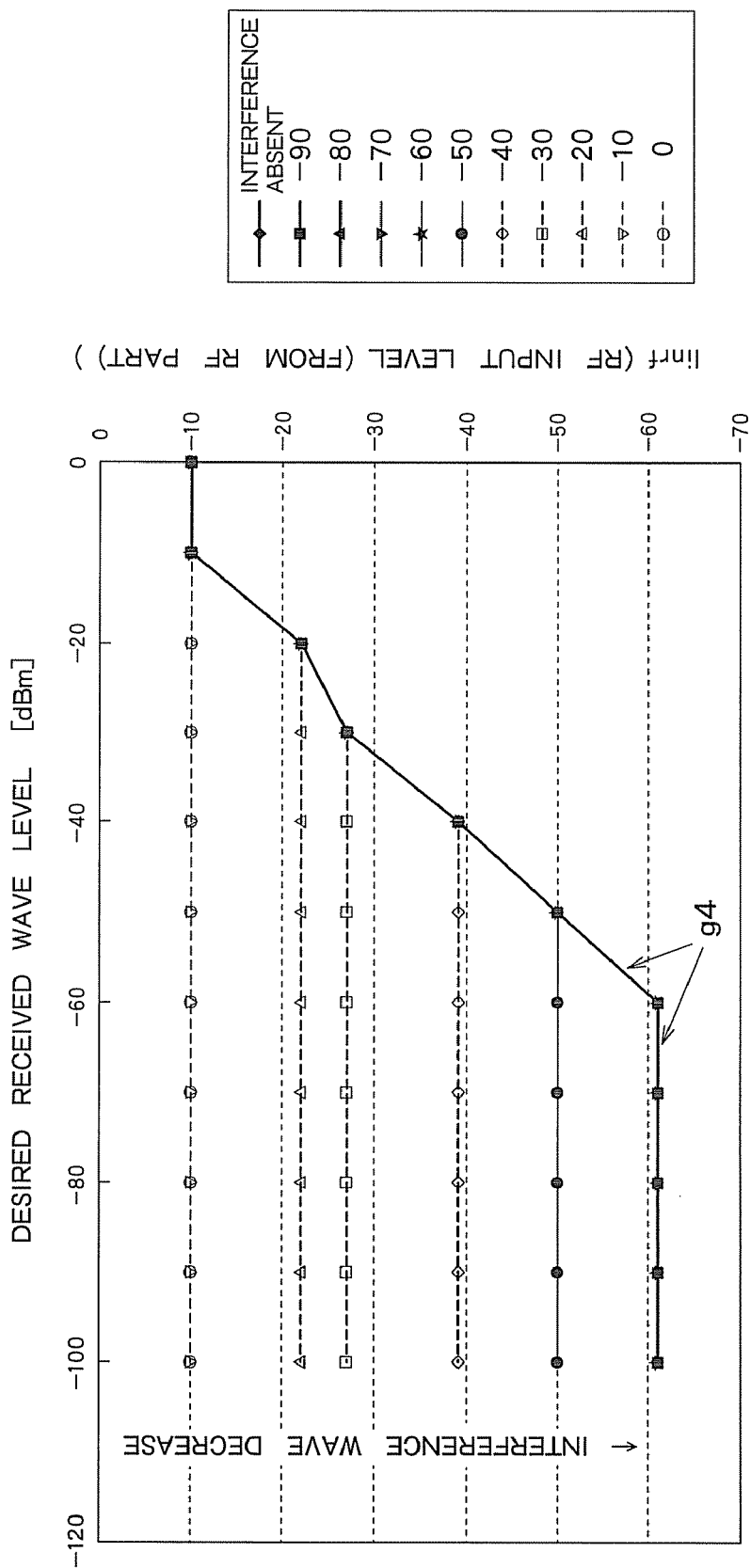
FIG. 7 is a graph showing a property of an RF input level linrf calculated from an RF part.

FIG. 7 is a graph showing a property of the RF input level linrf calculated from the RF part, and the horizontal axis represents the desired received wave level [dBm] input to the RF filter 12 and the vertical axis represents linrf [dBm]. The graph line g4 illustrated in FIG. 7 shows a property when no interference wave is present, and the graph line shifts upward as the interference wave increases.

Figure 8:
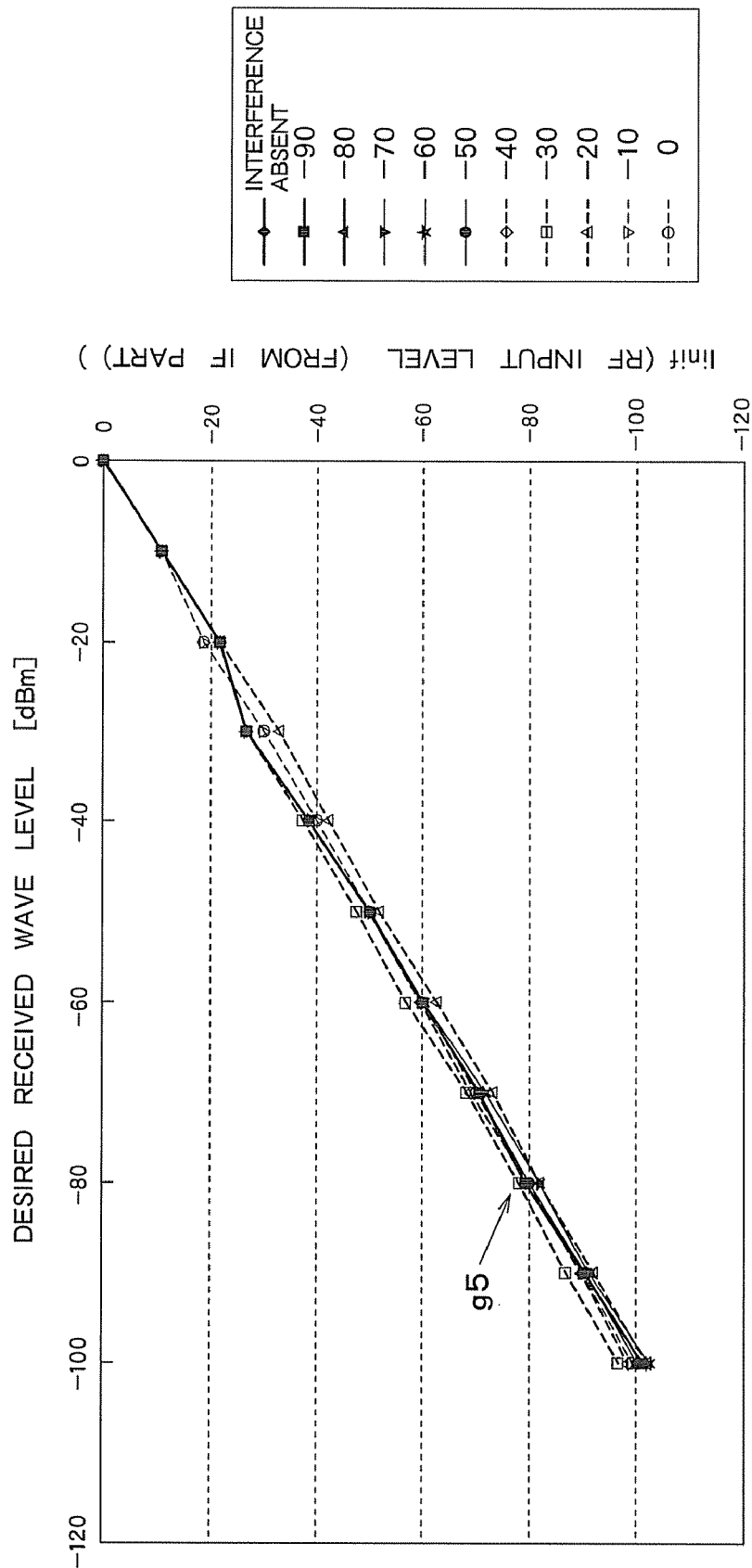
FIG. 8 is a graph showing a property of an RF input level linif calculated from an IF signal side.

FIG. 8 is a graph showing a property of the RF input level linif calculated from the IF signal side, and the horizontal axis represents the desired received wave level [dBm] input to the RF filter 12 and the vertical axis represents linif [dBm]. The graph line g5 illustrated in FIG. 8 shows a property when no interference wave is present, and even if the interference wave increases or decreases, the graph hardly changes.

Figure 9:
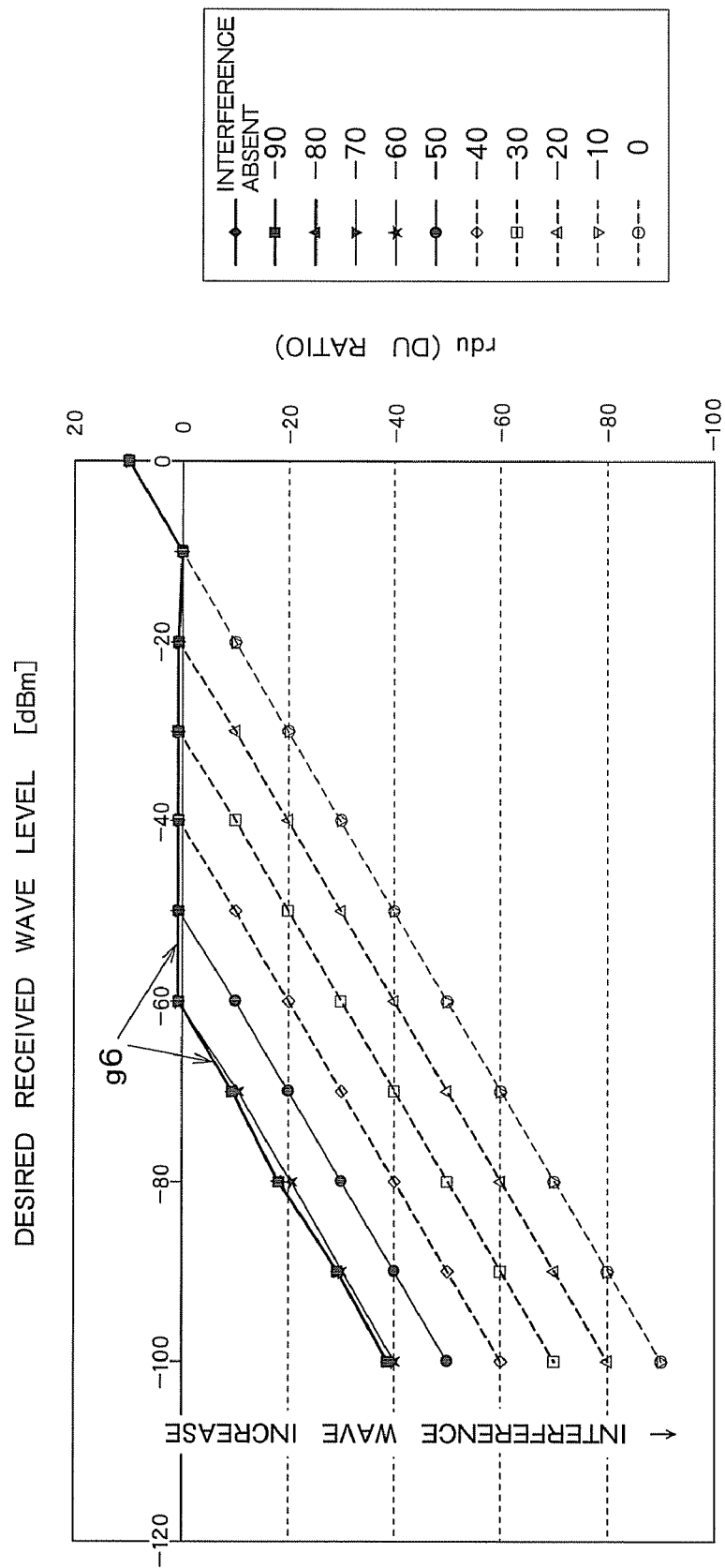
FIG. 9 is a graph showing a property of a DU ratio rdu calculated at Step S5 in FIG. 6.

FIG. 9 is a graph showing a property of the DU ratio rdu calculated at Step S5 in FIG. 6, and the horizontal axis represents the desired received wave level [dBm] input to the RF filter 12 and the vertical axis represents rdu [dBm]. The graph line g6 illustrated in FIG. 9 shows a property when no interference wave is present, and the graph line shifts downward as the interference wave increases.

The receiver in FIG. 1 is modeled to perform an operation simulation, thereby arriving at graphs in FIGS. 3 to 5 and FIGS. 7 to 9.

The adaptive controller 10 not only determines the presence/absence of an interference wave and the strength of a field intensity, but performs a variable control of the delay point of the RFGCA 14 and a variable control of the center frequency of the RF filter 12. The flowchart in FIG. 6 also shows a procedure of the variable control of the delay point and the variable control of the center frequency of the RF filter 12 (Step S14 or later).

FIG. 10 is a table listing control patterns of the adaptive controller 10. In FIG. 10, the delay point is abbreviated to "DP" and the property of the RF filter 12 is abbreviated to "FIL"

As shown in FIG. 10, the adaptive controller 10 performs a control of an operational current fed into each part in the receiver, a variable control of the delay point of the RFGCA 14, and a variable control of the center frequency of the RF filter 12, depending on the presence/absence of an interference wave and the strength of a field intensity determined by the processes of Steps S1-S13 in FIG. 6.

Note that a delay point is an input level at which the gain of the RFGCA 14 begins lowering. When an interference wave is present, it is known that by shifting the delay point to be larger, a received wave can be received even if the received wave is smaller. This is caused by a property that the RFAGC loop responds to the amplitude of the interference wave so that the gain of the pre-stage variable gain amplifier 2 to the mixer 15 is reduced more than needed.

For example, if a target amplitude of the output of the mixer 15 is (−16 dBm) and a maximum gain by adding the LNA 13 and the RFGCA 14 is 44 dB, the delay point value becomes (−16 dBm−44 dB=−60 dBm). When an interference wave (−55 dBm) and a received wave (−95 dBm) are input, the gain is compressed by (−55 dBm−(−60 dBm)=5 dB) in the RFGCA 14. The received wave equivalently corresponds to a case where a received wave (−95 dBm−5 dBm=−100 dBm) is input. If a limit of reception capability is (−98 dBm), the reception of the received wave becomes impossible.

When the target amplitude of the mixer 15 output is increased by 10 dB and is changed to (−6 dBm), the delay point value becomes (−50 dBm). When the interference wave (−55 dBm) and the received wave (−95 dBm) are input same as the above, the gain is not decreased in the RFGCA 14. The received wave is operated with the maximum gain and is passed with an equivalent signal level (−95 dBm) without any change, and the reception of the received wave becomes possible.

However, the delay point is not required to be simply enlarged, but to set based on a trade off with the distortion performance of each part inside the receiver. The adaptive controller 10 supplies the RFAGC reference level signal to the pre-stage amplifier controller 7. The pre-stage amplifier controller 7 generates a gain control voltage for setting a delay point of the RFGCA 14 based on this RFAGC reference level.

At Step S14 in FIG. 6, the adaptive controller 10 determines whether or not an interference wave is present and the gain grf of the RF part is equal to or less than a predetermined threshold. In a case where the interference wave is present and the gain grf is equal to or less than the predetermined threshold, the delay point (DP) is set as "large" and the center frequency of the RF filter 12 is shifted (Step S15). Otherwise, the delay point is set as "small" and the center frequency of the RF filter 12 is not shifted (Step S16).

Note that FIG. 10 shows that in case where the interference wave is present, the delay point is set as "large" and the center frequency of the RF filter 12 is shifted. In practice, the delay point and the center frequency of the RF filter 12 are set in consideration of also the gain grf of the RF part.

Meanwhile, when the field intensity "weak" or the interference wave is "present", the operational current is set as "large" (Steps S17 and S18). When the interference wave is "absent", determination is made whether or not the field intensity is "strong" (Step S19), if "strong", the operational current is set as "medium" (Step S20), and if not "strong", the operational current is set as "small" (Step S21).

As shown in FIG. 10, when the interference wave is determined as "absent", regardless of the field intensity, the delay point is set as "small" and the center frequency of the RF filter 12 is not shifted. However, when the field intensity is weak, the operational current fed through each part (such as the LNA 13, the RFGCA 14, the mixer 15, and the IFBPF 21) in the receiver is increased. The reason for increasing the operational current is in that it is necessary to obtain the amplification performance of low noise, low distortion, and high gain by exhibiting the performance of each part to the maximum extent.

As describe above, the adaptive controller 10 controls the operational current of each part inside of the receiver, in order to lower the noise and reduce the distortion in each part.

Meanwhile, when the interference wave is "absent" and the field intensity is medium, the low noise performance or low distortion performance is not required so much in the whole receiver. Accordingly, the operational current can be reduced in the range that degradation of the noise performance and the distortion performance is restricted within about several dBs, in both the LNA 13 and the RFGCA 14 at the pre-stage and the mixer 15 and the IFBPF 21 at the post-stage. Therefore, the operational current is set as "small" in this case.

Further, when the interference wave is "absent" and the field intensity is strong, since the level of the signal that passes through pre-stage side circuits before the mixer 15 is large, the low distortion performance is required and the operational current is set as "large". In post-stage side circuits subsequent to the mixer 15, since proper signal quality can be obtained, "small" is sufficient for the operational current. Accordingly, in the whole receiver, the operational current is set as "medium"

On the other hand, when the interference wave is determined as "present", regardless of the field intensity, the operational current of each part in the receiver is increased, the delay point is set as "large", and the center frequency of the RF filter 12 is shifted. The reason for performing such control is as follows. When the interference wave is present, a large interference wave and a small received wave have to be considered simultaneously. As a result, the performance of low noise and low distortion is required, and therefore, the operational current needs to be increased.

When a center frequency f0 of the RF filter 12 is not shifted, the signal passing loss becomes smallest in the case where the frequency of the received wave coincides with the center frequency f0, and the receiving sensitivity becomes good. Therefore, when no interference wave is present, the adaptive controller 10 does not shift the center frequency of the RF filter 12.

On the other hand, when the interference wave is present, it is advantageous to increase the DU ratio expressing a level difference between the interference wave and the received wave, and it is effective to intentionally shift the center frequency of the RF filter 12 with respect to the frequency of the received wave.

FIG. 11 is a table showing an example of a passing property of the RF filter 12, and shows a relation between the amount of frequency deviation from the center frequency and the gain. When the RF filter 12 having the property in FIG. 11 is used, it is assumed that an interference wave larger by 30 dB than a received wave is present on the level higher by 40 MHz than the received wave. If the center frequency of the RF filter 12 is the same as the frequency of the original received wave, an input DU ratio is (−30 dB), but it will be (−30+(0−(−15))=−15 dB) after passing through the RF filter 12.

If the property of the RF filter 12 is changed so that (received frequency minus 20 MHz) becomes a center frequency, the DU ratio after passing through the RF filter 12 is (−30+(−5−(−30))=−5 dB), and is improved by 10 dB.

Further, if the center frequency of the RF filter 12 is shifted too much, the level of the received wave becomes so small that reception becomes impossible. Due to the frequency relation and the signal level relation between the interference wave and the received wave, since an optimal shift amount differs and cannot be predicted, it is desirable to use together a method of preparing some kinds of candidates for the shift amount and selecting the optimal shift amount by trial and error.

Figure 12:
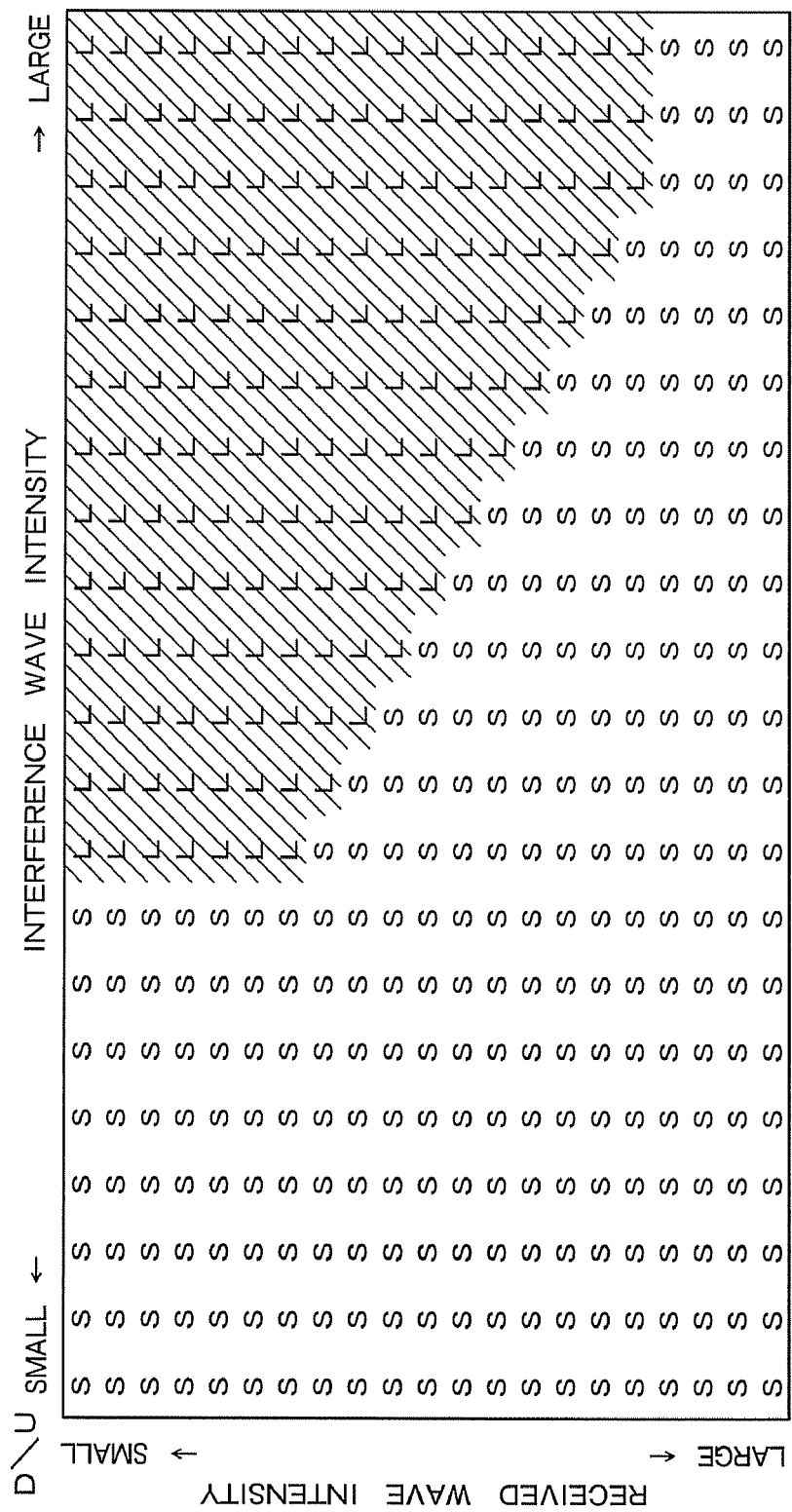
FIG. 12 is a view showing in detail a control of a delay point and a control of a shift amount of a center frequency of the RF filter 12.

FIG. 12 is a view showing in detail a control of a delay point and a control of a shift amount of the center frequency of the RF filter 12, and the horizontal axis represents the interference wave intensity and the vertical axis represents the received wave intensity. The "large" in FIG. 12 shows that the delay point is enlarged and the center frequency of the RF filter 12 is shifted. The "small" shows that the delay point is lowered and the center frequency of the RF filter 12 is not shifted. As seen from FIG. 12, it is understood as a general tendency that the adaptive controller 10 enlarges the delay point and also shifts the center frequency of the RF filter 12 as the interference wave becomes large.

Figure 13:
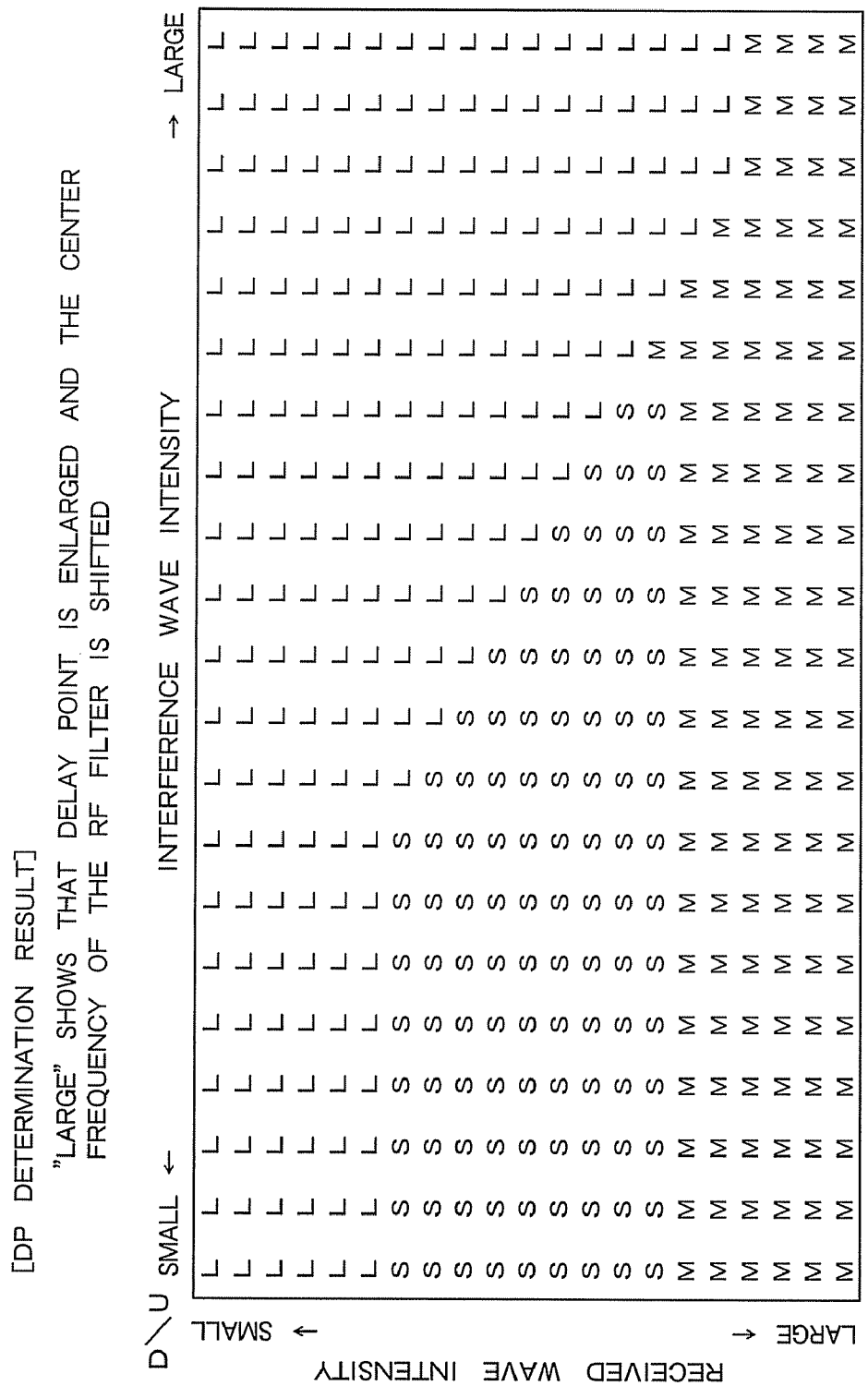
FIG. 13 is a view showing in detail a control of an operational current of each part inside of the receiver.

FIG. 13 is a view showing in detail a control of the operational current of each part inside of the receiver, and the horizontal axis represents the interference wave intensity and the vertical axis represents the received wave intensity. The "strong", "medium", and "small" in FIG. 13 show that the operational current is set large, medium, and small, respectively. As seen from FIG. 13, it is understood as a general tendency that the adaptive controller 10 increases the operational current when the received wave intensity is small and when the interference wave intensity is large, decreases the operational current when the received wave intensity is medium, and sets medium the operational current the when received wave intensity is large.

As described above, in the first embodiment, since the presence/absence of an interference wave is determined by the difference between the RF input level linrf calculated from the RF part and the RF input level linif calculated from the IF signal side and the field intensity is determined by the signal amplitude of linrf, the operational current of each part inside of the receiver, the delay point of the RFGCA 14, and the center frequency of the RF filter 12 can be controlled so that interference wave resistance becomes high and a reception rate can be improved.

In the first embodiment, since various kinds of controls are performed by using the signals before being input to the digital demodulator 11, the time response property is improved. It should be noted that any configuration can be used as the digital demodulator 11, and various types of conventional digital demodulators 11 can be used without any change, thereby simplifying design variation.

In addition, power consumption can be reduced by controlling the operational current of each part inside of the receiver.

Second Embodiment

The first embodiment performs the control based on the precondition that an IF signal level fluctuates. On the contrary, the IF signal level may be treated as a specified value. With this arrangement, although the control accuracy in the weak electric field deteriorates, almost the same result is obtained in the final determination so that the control process can be simplified.

FIG. 14 is a block diagram showing a schematic structure of a receiver according to a second embodiment of the present invention. In FIG. 14, the same numerals are given to the components that are common to those in FIG. 1, and the following will be described by focusing on differences from FIG. 1. In the receiver in FIG. 14, the IF signal level is regarded as a specified value, and the digital IF signal output from the first A/D converter 6 is not supplied to the adaptive controller 10. Other components are common to those in FIG. 1, and the adaptive controller 10 also processes with the same procedure as that shown in FIG. 6 and controls the operational current of each part inside of the receiver, the delay point of the RFGCA 14, and the center frequency of the RF filter 12.

Figure 15:
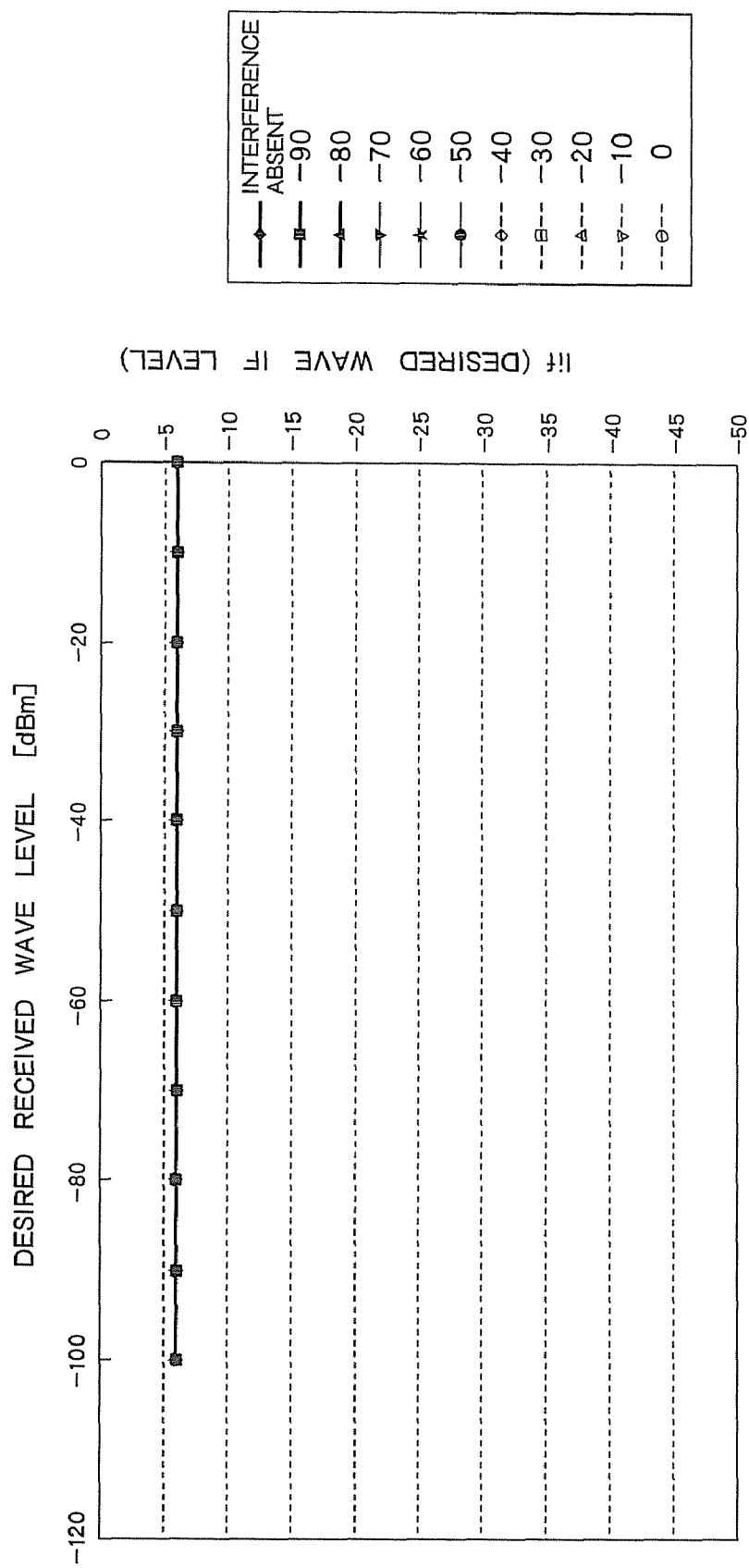
FIG. 15 is a graph showing a property of a digital IF signal obtained by converting an IF signal output from the IFGCA 22 by the first A/D converter 6 according to the second embodiment.

FIG. 15 is a graph, corresponding to FIG. 5, showing a property of a digital IF signal obtained by converting an IF signal output from the IFGCA 22 by the first A/D converter 6. As shown in FIG. 15, since an IF signal level is the specified value, it is not affected by an interference wave.

Figure 16:
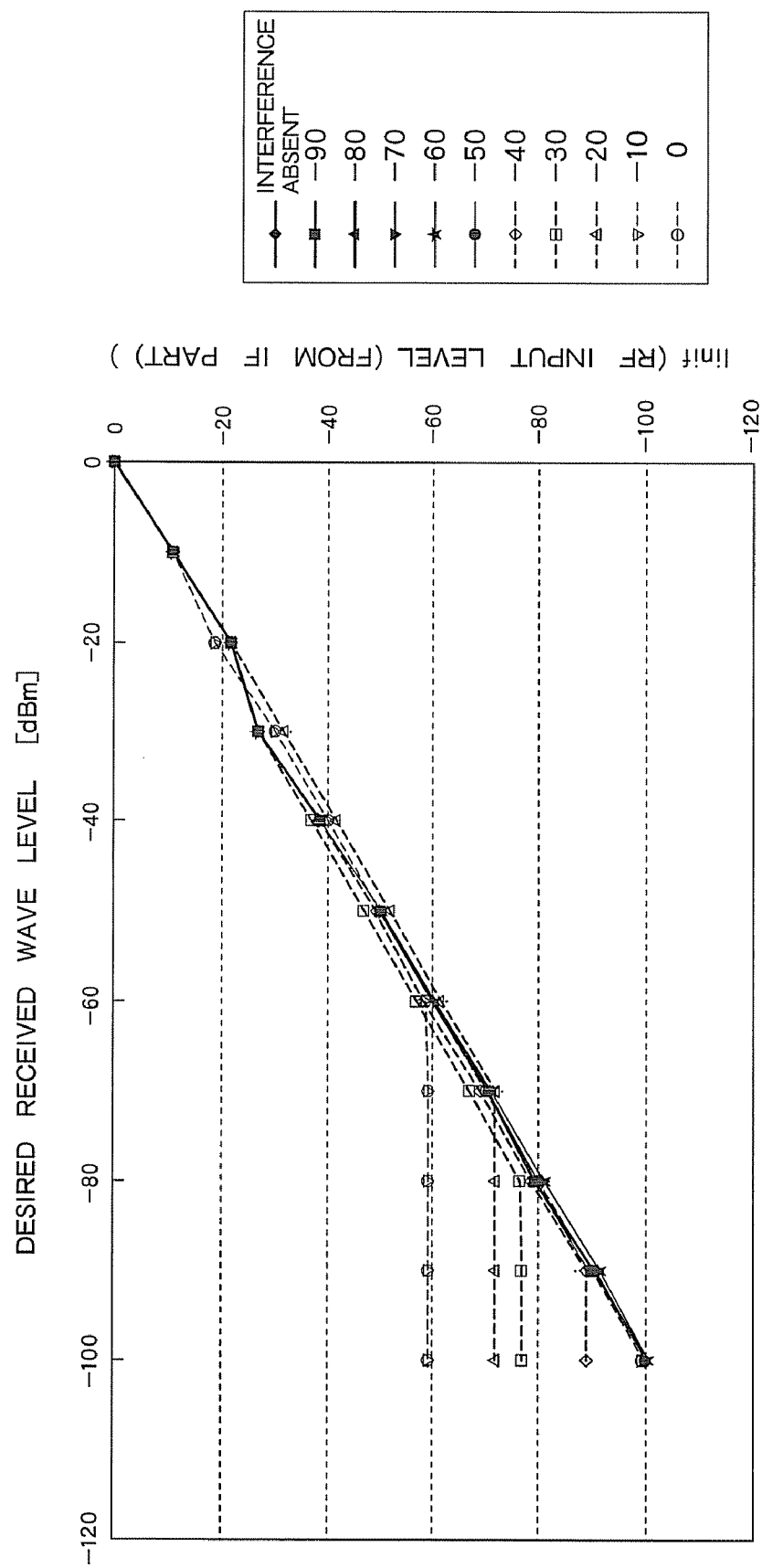
FIG. 16 is a graph showing a property of the RF input level linif calculated from the IF signal side according to the second embodiment.

FIG. 16 is a graph showing a property, corresponding to FIG. 8, of the RF input level linif calculated from the IF signal side. Although the graph in FIG. 8 is not affected by the interference wave, the graph in FIG. 16 is affected by the interference wave affects in the weak electric field. However, influence of the interference wave is little on the whole.

Figure 17:
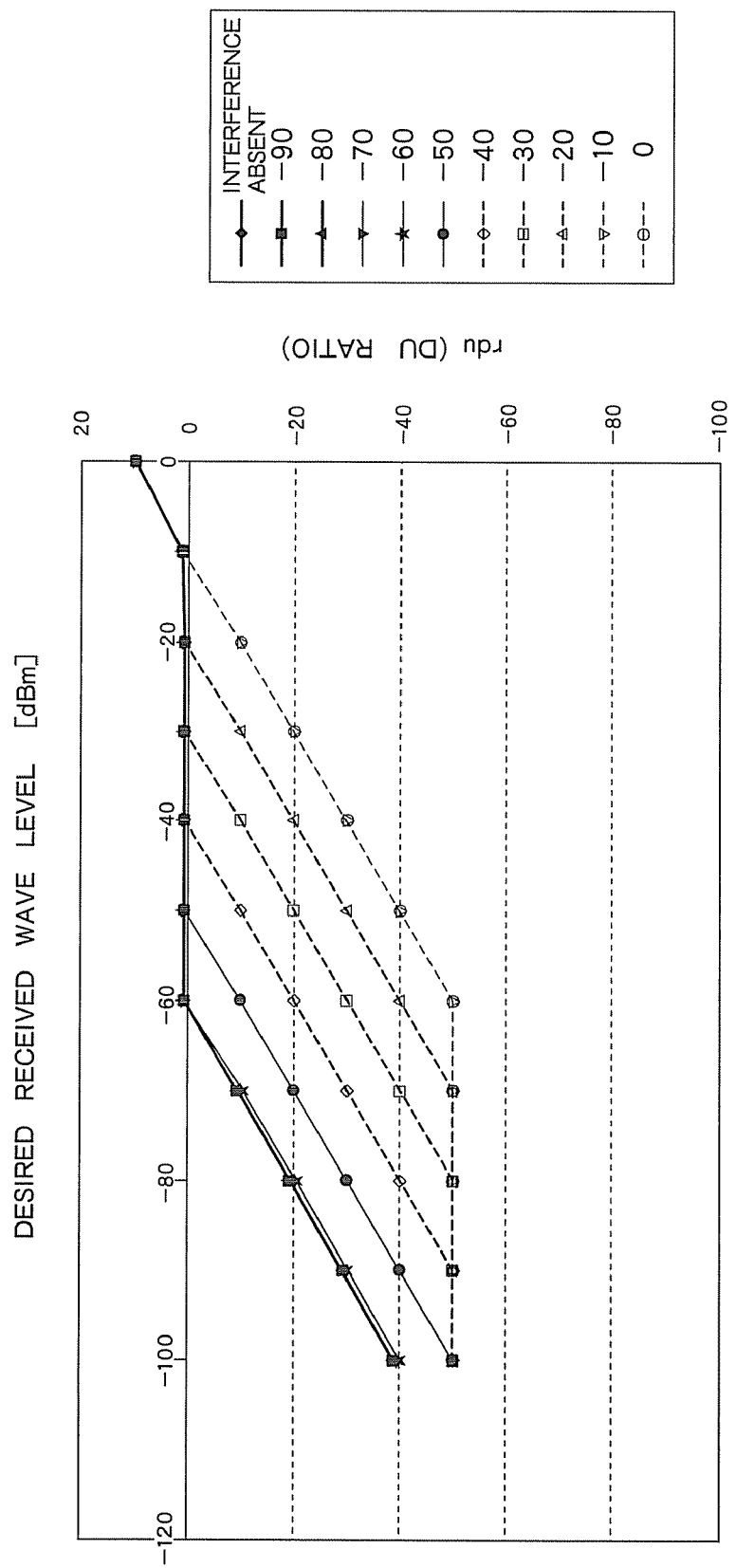
FIG. 17 is a graph showing a property of the DU ratio rdu.

FIG. 17 is a graph showing property, corresponding to FIG. 9, of the DU ratio rdu. FIG. 17 shows the almost same property as that in FIG. 9, and even if the IF signal level is set at the specified value, it is understood that there is almost no substantial influence.

As described above, in the second embodiment, by setting the IF signal level as the specified value, the operation of the adaptive controller 10 can be simplified and the time response property is improved rather than the first embodiment.

(Other Modifications)

The first and the second embodiments illustrate controlling the operational current, the center frequency of the RF filter 12, and the delay point of the RFGCA 14. As a modified example, at least one characteristic among the above three characteristics may be controlled. Alternatively, circuit characteristics other than these three characteristics may be controlled.

The configuration shown in FIG. 1 or FIG. 14 is an example, and various modifications can be considered. For example, the LNA 13 and the RFGCA 14 may be provided integrally, or the LNA 13 and the RF filter 12 may be provided separately.

As a configuration of the mixer 15, the multiple mixers 15 may be provided. For example, the mixer 15 for an I signal may be provided separately from that for a Q signal which differ in a phase about 90 degrees.

The IFBPF 21 may be a low pass filter that removes only a high band. A filter for image reduction may be provided separately from the IFBPF 21.

The operational current or the like may be controlled by a different procedure from the procedure in FIG. 6. A part or all of the receiver in FIG. 1 may be constituted of one or more semiconductor chips, or may be constituted of a discrete circuit.

In the embodiments described above, a frequency of the IF signal centered on 500 kHz is taken as an example. As a modified example, an intermediate frequency about 30 MHz to 70 MHz that is used in the TV tuner field for several decades may be used, or zero IF (I signals and Q signals with 0 Hz as the center frequency) may be used.

Although based on above description, those skilled in the art can figure out additional effects and variations of the present invention, the aspect of the present invention is not limited to the stated each embodiments. Various additions, alterations and partial deletions can be done to the present invention within the conceptualistic thought and purpose of the present invention drawn on the claims and the equivalents.

What is claimed is:

1. A receiver comprising:
a pre-stage variable gain amplifier configured to amplify an RF signal received by an antenna;
a frequency converter configured to convert an output signal of the pre-stage variable gain amplifier into a low frequency signal to output the low frequency signal;
a filter unit configured to selectively extract a receiving channel frequency band component from the low frequency signal;
a post-stage variable gain amplifier configured to amplify the output signal of the filter unit;
a pre-stage amplifier controller configured to adjust a gain of the pre-stage variable gain amplifier so that an output amplitude of the frequency converter approaches a target value;
a post-stage amplifier controller configured to adjust a gain of the post-stage variable gain amplifier so that an output amplitude of the post-stage variable gain amplifier approaches a target value; and
an adaptive controller configured to detect a receiving status including at least one of presence or absence of an interference wave and a strength of a field intensity based on the gain of the pre-stage variable gain amplifier and the gain of the post-stage variable gain amplifier, and control an operational current of at least one of parts inside of the receiver based on the detected result.

2. The receiver according to claim 1, further comprising:
an A/D converter configured to convert the output signal of the post-stage variable gain amplifier into a digital value; and
a digital demodulator configured to perform demodulation process based on the digital value,
wherein the adaptive controller is configured to detect the receiving status based on the digital value.

3. The receiver according to claim 1, wherein the adaptive controller is configured to determine presence or absence of the interference wave based on an output level of the frequency converter, an output level of the post-stage variable gain amplifier and a gain of the post-stage variable gain amplifier.

4. The receiver according to claim 3, wherein the adaptive controller is configured to determine that the interference wave is present when a value obtained by subtracting the output level of the frequency converter and the gain of the post-stage variable gain amplifier from the output level of the post-stage variable gain amplifier is less than a predetermined reference value.

5. The receiver according to claim 1, wherein the adaptive controller is configured to determine the strength of the field intensity based on the output level of the frequency converter and the gain of the pre-stage variable gain amplifier.

6. The receiver according to claim 1, further comprising an RF filter configured to pass a predetermined frequency band signal included in the RF signal,
wherein the adaptive controller is configured to control at least one of an intermediate frequency of the RF filter, a delay point indicative of an input level of the pre-stage variable gain amplifier that the gain begin lowering, and an operational current of each part inside of the receiver based on a result of detecting the receiving status.

7. The receiver according to claim 6, wherein the adaptive controller is configured to detect presence or absence of the interference wave and a strength of the field intensity as the receiving status, and set the operational currents in accordance with presence or absence of the interference wave and the strength of the field intensity.

8. The receiver according to claim 6, wherein:
the adaptive controller is configured to detect presence or absence of the interference wave as the receiving status; and
when the interference wave is present, the adaptive controller determines whether the intermediate frequency of the RF filter should be shifted in accordance with the gain of the pre-stage variable gain amplifier.

9. The receiver according to claim 6, wherein:
the adaptive controller is configured to detect presence or absence of the interference wave as the receiving status; and
when the interference wave is present, the adaptive controller determines whether the delay point is enlarged in accordance with the gain of the pre-stage variable gain amplifier.

10. A receiver comprising:
a pre-stage variable gain amplifier configured to amplify an RF signal received by an antenna;
a frequency converter configured to convert an output signal of the pre-stage variable gain amplifier into a low frequency signal to output the low frequency signal;
a filter unit configured to selectively extract a receiving channel frequency band component from the low frequency signal;
a post-stage variable gain amplifier configured to amplify the output signal of the filter unit;
a pre-stage amplifier controller configured to adjust a gain of the pre-stage variable gain amplifier so that an output amplitude of the frequency converter approaches a target value;
a post-stage amplifier controller configured to adjust a gain of the post-stage variable gain amplifier so that an output amplitude of the post-stage variable gain amplifier approaches a target value; and
an adaptive controller configured to detect a receiving status including at least one of presence or absence of an interference wave and a strength of a field intensity based on the gain of the pre-stage variable gain amplifier, the gain of the post-stage variable gain amplifier and an output signal amplitude of the post-stage variable gain amplifier, and control an operational current of at least one of parts inside of the receiver based on the detected result.

11. The receiver according to claim 10, further comprising:
an A/D converter configured to convert the output signal of the post-stage variable gain amplifier into a digital value; and
a digital demodulator configured to perform demodulation process based on the digital value,
wherein the adaptive controller is configured to detect the receiving status based on the digital value.

12. The receiver according to claim 10, wherein the adaptive controller is configured to determine the strength of the field intensity based on the output level of the frequency converter and the gain of the pre-stage variable gain amplifier.

13. The receiver according to claim 10, wherein the adaptive controller is configured to determine presence or absence of the interference wave based on an output level of the frequency converter, a gain of the pre-stage variable gain amplifier, an output level of the post-stage variable gain amplifier and a gain of the post-stage variable gain amplifier.

14. The receiver according to claim 13, wherein the adaptive controller is configured to determine that the interference wave is present when a value obtained by subtracting the output level of the frequency converter and the gain of the post-stage variable gain amplifier from the output level of the post-stage variable gain amplifier is less than a predetermined reference value.

15. The receiver according to claim 10, further comprising an RF filter configured to pass a predetermined frequency band signal included in the RF signal,
wherein the adaptive controller is configured to control at least one of an intermediate frequency of the RF filter, a delay point indicative of an input level of the pre-stage variable gain amplifier that the gain begin lowering, and an operational current of each part inside of the receiver based on a result of detecting the receiving status.

16. The receiver according to claim 15, wherein the adaptive controller is configured to detect presence or absence of the interference wave and a strength of the field intensity as the receiving status, and set the operational currents in accordance with presence or absence of the interference wave and the strength of the field intensity.

17. The receiver according to claim 15, wherein:
the adaptive controller is configured to detect presence or absence of the interference wave as the receiving status; and
when the interference wave is present, the adaptive controller determines whether the delay point is enlarged in accordance with the gain of the pre-stage variable gain amplifier.

18. The receiver according to claim 15, wherein:
the adaptive controller is configured to detect presence or absence of the interference wave as the receiving status; and
when the interference wave is present, the adaptive controller determines whether the intermediate frequency of the RF filter should be shifted in accordance with the gain of the pre-stage variable gain amplifier.

* * * * *